United States Patent
Jung et al.

(10) Patent No.: US 9,184,340 B2
(45) Date of Patent: Nov. 10, 2015

(54) NON-POLAR NITRIDE-BASED LIGHT EMITTING DEVICE AND METHOD FOR FABRICATING THE SAME

(75) Inventors: Sukkoo Jung, Seoul (KR); Younghak Chang, Seoul (KR); Hyunggu Kim, Seoul (KR); Kyuhyun Bang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/469,514

(22) Filed: May 11, 2012

(65) Prior Publication Data

US 2012/0286286 A1 Nov. 15, 2012

(30) Foreign Application Priority Data

May 13, 2011 (KR) .......................... 10-2011-0045166

(51) Int. Cl.
*H01L 33/22* (2010.01)
*H01L 33/02* (2010.01)
*H01L 33/32* (2010.01)

(52) U.S. Cl.
CPC .............. *H01L 33/02* (2013.01); *H01L 33/22* (2013.01); *H01L 33/32* (2013.01)

(58) Field of Classification Search
CPC ..................................................... H01L 33/22
USPC .......................................... 257/95, 98; 438/29
See application file for complete search history.

(56) References Cited

U.S. PATENT DOCUMENTS

| | | | |
|---|---|---|---|
| 7,504,667 B2 * | 3/2009 | Fujikura et al. .................. | 257/98 |
| 7,595,514 B2 * | 9/2009 | Lai .................................. | 257/99 |
| 7,781,247 B2 * | 8/2010 | Tran ................................. | 438/47 |
| 2008/0067497 A1 * | 3/2008 | Kim ................................. | 257/13 |
| 2009/0140287 A1 * | 6/2009 | Fujiwara et al. ............... | 257/103 |
| 2009/0152578 A1 * | 6/2009 | Lee .................................. | 257/96 |
| 2009/0261318 A1 * | 10/2009 | Cheong ............................ | 257/13 |
| 2010/0012920 A1 * | 1/2010 | Park et al. ........................ | 257/13 |
| 2011/0244610 A1 * | 10/2011 | Saito et al. ...................... | 438/29 |
| 2012/0001220 A1 * | 1/2012 | Hiraiwa et al. .................. | 257/98 |
| 2012/0074381 A1 * | 3/2012 | Yang et al. ....................... | 257/13 |

FOREIGN PATENT DOCUMENTS

| | | |
|---|---|---|
| JP | 2005-085932 | 3/2005 |
| JP | 4233268 B2 | 3/2009 |
| KR | 10-2008-0013341 A | 2/2008 |
| KR | 10-0986557 | 10/2010 |
| WO | WO 2010100949 A1 * | 9/2010 |

OTHER PUBLICATIONS

Chitnis et al., 'Visible light-emitting diodes using a-plane GaN-InGaN multiple quantum wells over r-plane sapphire,' 2004, Appl. Phys. Lett. vol. 84 No. 18, pp. 3663-3665.*
Korean Notice of Allowance for Application No. 10-2011-0045166 dated Oct. 28, 2014.

* cited by examiner

*Primary Examiner* — Bryan Junge
(74) *Attorney, Agent, or Firm* — KED & Associates LLP

(57) ABSTRACT

Disclosed are a non-polar nitride-based light emitting device and a method for fabricating the same. The non-polar nitride-based light emitting device includes a substrate, a first-type semiconductor layer on the substrate, an active layer on the active layer, a second-type semiconductor layer on the active layer, a light extraction layer on the second-type semiconductor layer and including at least one layer including indium having a plurality of unit structures having an inverted pyramidal intaglio shape, a first electrode electrically connected to the first-type semiconductor layer, and a second electrode electrically connected to the second-type semiconductor layer.

19 Claims, 9 Drawing Sheets

NON-POLAR NITRIDE-BASED LIGHT EMITTING DEVICE AND METHOD FOR FABRICATING THE SAME

This application claims the benefit of Korean Patent Application No. 10-2011-0045166, filed on May 13, 2011, which is hereby incorporated by reference as if fully set forth herein.

BACKGROUND OF THE INVENTION

1. Field of the Invention

The present invention relates to a semiconductor light emitting device, and more particularly, to a non-polar nitride-based light emitting device and a method for fabricating the same.

2. Discussion of the Related Art

Gallium nitride (GaN) used as a material of a semiconductor device, such as a blue light emitting diode, has a Wurzite crystal structure, and is grown as a thin film mainly in a c-plane crystal direction. The reason for this is that growth of GaN in the c-plane crystal direction facilitates horizontal growth and thus forms a high-quality thin film having minimum defects, such as dislocation.

Here, GaN has a crystal structure in which a nitrogen layer and a gallium layer are alternately repeated in the growth direction. Therefore, a strong internal field is present between nitrogen and gallium and thus polarization occurs.

The internal field is divided into two components, such as spontaneous polarization and piezo-electric polarization, and if a layer having a different lattice constant, such as an InAlGaN layer, is inserted, polarization increases and thus quantum confined stark effects may occur.

For example, in a structure in which an InAlGaN active layer is inserted between p-type and n-type GaN layers, as in a blue light emitting diode, deformation occurs between the layers due to a lattice constant difference, and such deformation may generate an internal field and cause warpage of an energy band structure of the active layer.

Consequently, wave functions of electrons and holes within the active layer are spatially separated and the size of an energy gap is greatly reduced, and this may cause lowering of recombination efficiency.

SUMMARY OF THE INVENTION

Accordingly, the present invention is directed to a non-polar nitride-based light emitting device and a method for fabricating the same.

An object of the present invention is to provide a non-polar nitride-based light emitting device and a method for fabricating the same in which, when a non-polar nitride-based light emitting diode using a heterogeneous substrate is fabricated, allow the upper surface of the non-polar nitride-based light emitting diode to have a light extraction structure in order to improve light extraction efficiency.

Another object of the present invention is to provide a non-polar nitride-based light emitting device and a method for fabricating the same in which, when a non-polar nitride-based light emitting diode using a heterogeneous substrate is fabricated, form a light extraction structure without lowering of serial resistance and contact resistance of a p-type semiconductor GaN material.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a non-polar nitride-based light emitting device includes a substrate, a first-type semiconductor layer on the substrate, an active layer on the first-type semiconductor layer, a second-type semiconductor layer on the active layer, a light extraction layer on the second-type semiconductor layer and including at least one layer including indium having a plurality of unit structures with an inverted pyramidal intaglio shape, a first electrode electrically connected to the first-type semiconductor layer, and a second electrode electrically connected to the second-type semiconductor layer.

In another aspect of the present invention, a non-polar nitride-based light emitting device includes a substrate, a first-type semiconductor layer on the substrate, an active layer on the first-type semiconductor layer, a second-type semiconductor layer on the active layer and including a light extraction structure including a plurality of first unit structures having an inverted pyramidal intaglio shape and a plurality of second unit structures located between the plurality of first unit structures and having an intaglio shape and a size smaller than the plurality of first unit structures, a first electrode electrically connected to the first-type semiconductor layer, and a second electrode electrically connected to the second-type semiconductor layer.

In a further aspect of the present invention, a method of fabricating a non-polar nitride-based light emitting device includes forming a semiconductor structure including a first semiconductor layer, an active layer and a second-type semiconductor layer using a non-polar nitride-based material on a sapphire substrate, forming a light extraction layer including indium having a plurality of unit structures having an inverted pyramidal intaglio shape on the semiconductor structure, forming a transparent conductive layer on the light extraction layer, forming a first electrode electrically connected to the first-type semiconductor layer, and forming a second electrode on the transparent conductive layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
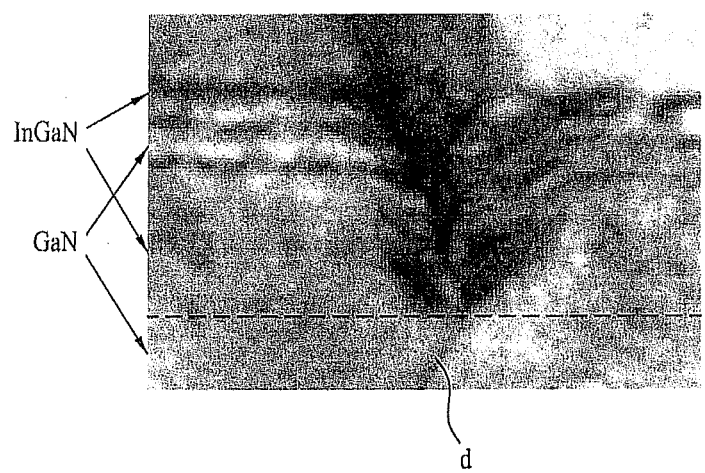
FIG. 1 is a TEM photograph illustrating growth characteristics due to indium gallium nitride layers.

Reference will now be made in detail to the preferred embodiments of the present invention, examples of which are illustrated in the accompanying drawings.

However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims.

It will be understood that when an element is referred to as being "on" another element, it can be directly on the element, and one or more intervening elements may also be present.

Although terms, such as first, second, etc., may be used to described various elements, components, regions, layers and/or regions, it will be understood that the these terms are not intended to limit the elements, components, regions, layers and/or regions.

Non-polar GaN is a crystalline material in which polarization in a growth direction is not present, and may be implemented through growth in a direction rotating at an angle of 90° with the upper plane, i.e., a c-plane, of a Wurzite crystal structure. In this case, since nitrogen (N) layers and gallium (Ga) layers are provided in the same number within the plane in the growth direction, an inner field in the growth direction is cancelled, polarization characteristics are not represented.

Therefore, distortion of an energy band due to piezoelectric polarization is not generated, and problems, such as lowering of recombination efficiency of electrons and holes within an active layer, may be improved.

Further, a c-plane GaN-based material in which design of an active layer is limited to a designated thickness or less, non-polar GaN may greatly alleviate limit in thickness and thus may achieve design of an active layer suitable for high current driving.

In growth of a thin film of such non-polar GaN using a heterogeneous substrate, a-plane GaN may be grown on an r-plane sapphire substrate.

In general, photovoltaic efficiency of a light emitting diode is divided into three kinds of efficiency. That is, photovoltaic efficiency of the light emitting diode may be divided into an internal quantum efficiency representing a degree of conversion of electrons injected from the outside of an active layer into photons by recombination, light extraction efficiency representing a degree of emission of the generated photons to the outside of the light emitting diode without optical loss due to internal defects, and injection efficiency representing lowering of voltage due to serial resistance.

As technique to improve light extraction efficiency, a design method which minimizes total internal reflection generated between layers having different indexes of refraction is employed.

In a c-plane GaN-based light emitting diode, a patterned sapphire substrate (PSS) in which prominences and depressions are formed on a sapphire substrate to extract a larger amount of light through the upper surface of the light emitting diode, and p-GaN surface roughening in which prominences and depressions having a designated size are formed at a p-type semiconductor surface area located on the light emitting diode to reduce the probability of total reflection between a p-type GaN layer and an external area.

Non-polar GaN-based heterogeneous thin film growth has anisotropic epitaxial growth characteristics in the plane direction, differently from c-plane GaN having isotropic growth characteristics in the plane direction, and particularly has characteristics in that growth in the c-plane direction is prioritized. Therefore, it is not easy to grow a high-quality GaN layer having little defects, and it is difficult to form a thin film having excellent planarization and thus growth a high-quality non-polar GaN-based heterogeneous thin film on a sapphire substrate having prominences and depressions is not easy.

Further, it is difficult to control the surface shape of the GaN layer due to magnesium injection or low growth temperature applied to the c-plane based on different crystal growth characteristics, in a p-GaN surface prominences and depressions formation method.

Hereinafter, a non-polar light emitting diode which is fabricated by growing an a-plane GaN-based material on an r-plane sapphire substrate through the above-described non-polar GaN thin film growth using a heterogeneous substrate, and a method for fabricating the same will be described in detail with reference to the accompanying drawings.

FIG. 1 illustrates results measured by a transmission electron microscope (TEM), showing growth development characteristics if indium gallium nitride (InGaN) layers having a lattice constant difference with a-plane gallium nitride (GaN) layers are inserted and stacked between the a-plane gallium nitride (GaN) layers.

It may be confirmed that dislocation d are present due to growth of a heterogeneous thin film within a GaN layer area. If this dislocation d meet the InGaN layer, V-shaped pits (grooves) having a designated angle in the crystal direction are formed.

As shown in FIG. 1, it is understood that as growth of the GaN-based layers is continued, the size of the formed pits is increased in the growth direction.

Figure 2:
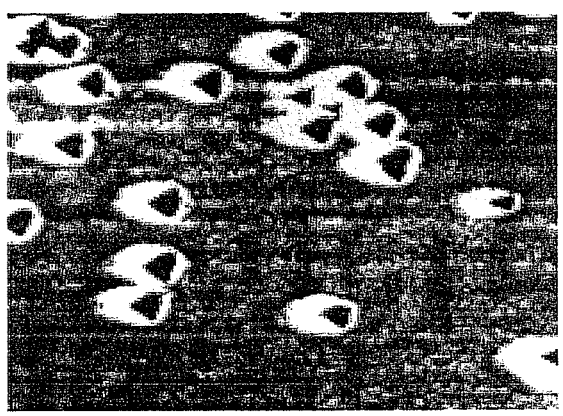
FIG. 2 is an AFM photograph illustrating a surface measured after growth of indium gallium nitride layers and gallium nitride layers.

FIG. 2 illustrates results measured by an atomic force microscope (AFM), showing a surface if a-plane gallium nitride (InGaN) layers are inserted and grown. It may be confirmed that detects having an inverted pyramidal pit (intaglio) shape having a designated angle in the crystal direction are formed.

Since such an intaglio shape may be generated by stress due to differences of lattice constants and growth temperatures between respective layers, the more clear intaglio shape is formed as the larger the content of indium (In) in the growth InGaN layer is and as the greater the thickness of the InGaN layer is.

Further, the density of the V-shaped grooves is determined by presence of dislocation of the GaN layer located thereunder. The reason for this is that such a V-shaped groove is first started from the dislocation as a starting point.

The inverted pyramidal intaglio shape due to the V-shaped grooves may form prominences and depressions on the surface of a light emitting diode, and these prominences and depressions may be used as a light extraction layer to improve light extraction efficiency of the light emitting diode.

Figure 3:
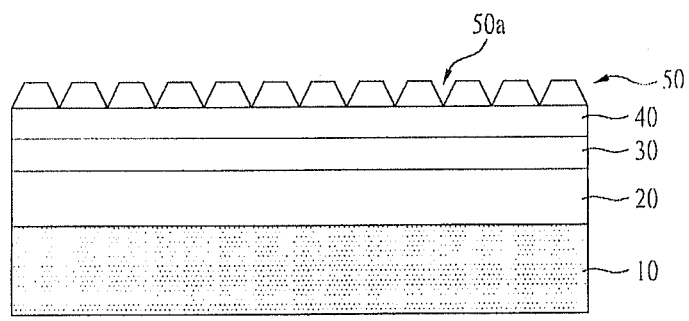
FIG. 3 is a cross-sectional view illustrating a thin film structure having a light extraction layer including indium.

As shown in FIG. 3, a non-polar light emitting diode includes an a-plane n-type GaN layer 20, an active layer 30 including at least one InAlGaN layer, and a p-type GaN layer 40 on an r-plane sapphire substrate 10.

These nitride semiconductor layers 20, 30 and 40 having an a-plane crystal direction may be formed through various methods, such as metal organic chemical vapor deposition (MOCVD), molecular beam epitaxy (MBE) and hydride vapor phase epitaxy (HVPE), and in this embodiment, the nitride semiconductor layers 20, 30 and 40 are formed using MOCVD.

Here, the p-type GaN layer 40 may have a thickness of 1 to 1,000 nm, and includes a p-type impurity, such as Mg. A light extraction layer 50 including a plurality of unit structures 50a having an inverted pyramidal intaglio shape is grown on a p-n light emitting diode structure (a light emitting diode wafer) formed on the substrate 10.

The light extraction layer 50 is formed of one p-type indium gallium nitride (InGaN) layer, and the light extraction layer 50 may have a thickness of 10 to 1,000 nm.

The InGaN layer forming the light extraction layer 50 may be grown under a nitrogen and oxygen atmosphere, the growth temperature of the InGaN layer is in the range of 700 to 1,000° C., and a reaction chamber is maintained at a pressure of 50 to 500 mbar during the growth process of the InGaN layer. In order to implement properties of a p-type semiconductor, an impurity, such as Mg, may be injected into the InGaN layer.

Further, an In content in the InGaN layer forming the light extraction layer 50 may be adjusted such that light discharged from the active layer 30 is not absorbed by the light extraction layer 50, and may be lower than 0.18 (18%) of a Ga content in consideration of emission of blue light. The In content may be 1 to 12% of group III elements ($In_xGa_{1-x}N$; $0.01 \leq x \leq 0.12$).

Figure 4:
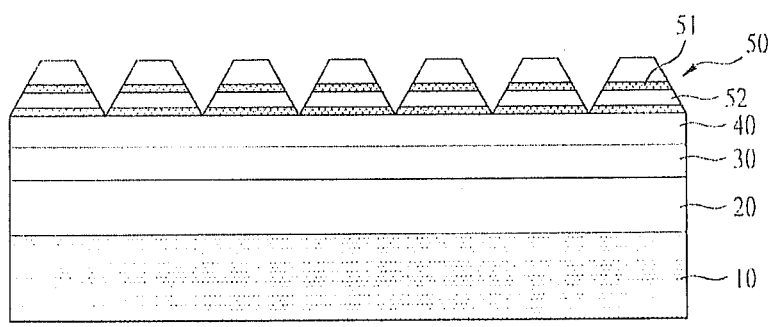
FIG. 4 is a cross-sectional view illustrating a thin film structure having a light extraction layer in which indium gallium nitride layers and gallium nitride layers are alternately stacked.

As shown in FIG. 4, the light extraction layer 50 may be formed in a structure in which first layers 51 including InGaN and second layers 52 including GaN are alternately stacked.

Here, InGaN layers forming the first layers 51 and GaN layers forming the second layers 52 may be grown under the nitrogen and hydrogen atmosphere, or the respectively InGaN and GaN layers may be alternately grown under the nitrogen or hydrogen atmosphere. The InGaN layers may be grown at a growth temperature of 650 to 950° C., the GaN layers may be grown at a growth temperature of 700 to 1,100° C., and the growth pressure may be in the range of 50 to 500 mbar.

In order to implement properties of a p-type semiconductor, an impurity, such as Mg, may be injected into the light extraction layer 50. The impurity may be injected only to the GaN layers forming the second layers 52, or may be injected to the overall area of the light extraction layer 50 including the InGaN layers forming the first layers 51.

The respective first layers 51 may have a thickness in the range of 1 to 100 nm, and the number of cycles of the first layers 51 and the second layers 52 may be 2 to 50 pairs. Particularly, in growth of the GaN layers forming the second layers 52, a growth condition in that a growth velocity in the vertical direction is higher than a growth velocity in the horizontal direction may be used to more effectively form the prominences and depressions on the surface of the light extraction layer 50.

That is, growth of the GaN layers forming the second layers 52 may be carried out in a condition in that the growth velocity is lowered, or a condition in that an III-V ratio is raised.

Here, as shown in FIG. 4, the plural unit structures 50a having the inverted pyramidal intaglio shape may be formed to expand in the upward direction along the thicknesses of the first layers 51 and the second layers 52.

The first layers 51 may have a thickness of 5 to 10 nm, and the second layers 52 may have a thickness of 3 to 6 nm.

Figure 5:
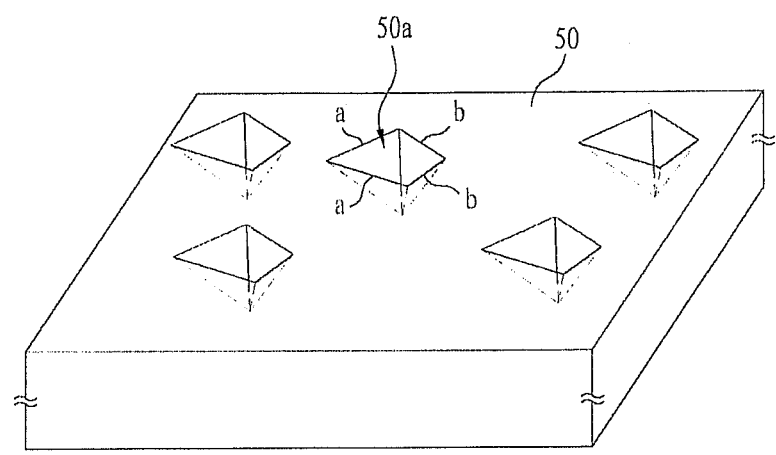
FIG. 5 is a schematic view illustrating unit structures of a light extraction layer.

Since the unit structures 50a have the inverted pyramidal intaglio shape, each of the unit structure 50a may have a virtual base plane, and the virtual base plane may have a rectangular shape, as shown in FIG. 5. In more detail, this rectangular shape may be a lozenge shape or diamond shape, and may be a shape in which lengths of four sides are not equal, in some cases.

FIG. 5 is a schematic view illustrating the unit structures 50a. As shown in FIG. 5, each of the unit structures 50a may form a shape in which two sides from among four sides have the same first length "a" and the remaining two sides have the same second length "b". Here, the first length "a" and the second length "b" may be different. Such a shape may relate to the crystal structure forming the a-plane n-type GaN layer 20 on the r-plane sapphire substrate 10.

Figure 6:
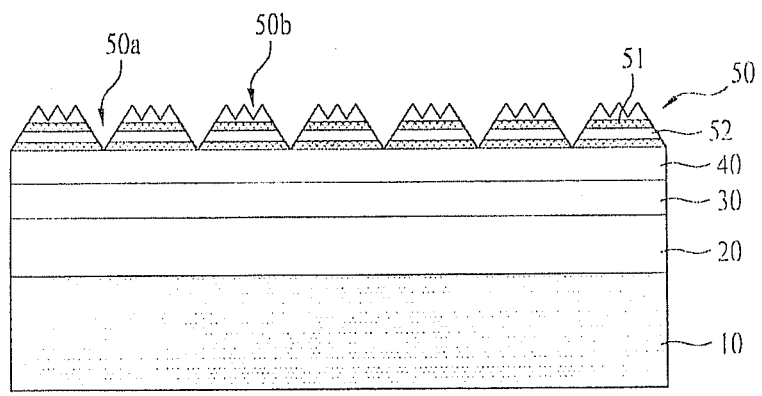
FIG. 6 is a cross-sectional view illustrating another light extraction layer.

Further, as shown in FIG. 6, unit structures 50b having a smaller size than the unit structures 50a may be formed at portions where the unit structures 50a meet each other. For convenience, the unit structures 50a having a relatively large size are referred to as first unit structures, and the unit structures 50b having a relatively small size are referred to as second unit structures.

These second unit structures 50b are located between the first unit structures 50a and may increase surface roughness of the light extraction layer 50. When the first unit structures 50a and the second unit structures 50b are arranged along the surface of the light extraction layer 50, light extraction efficiency of the light extraction layer 50 may be more improved.

Figure 7:
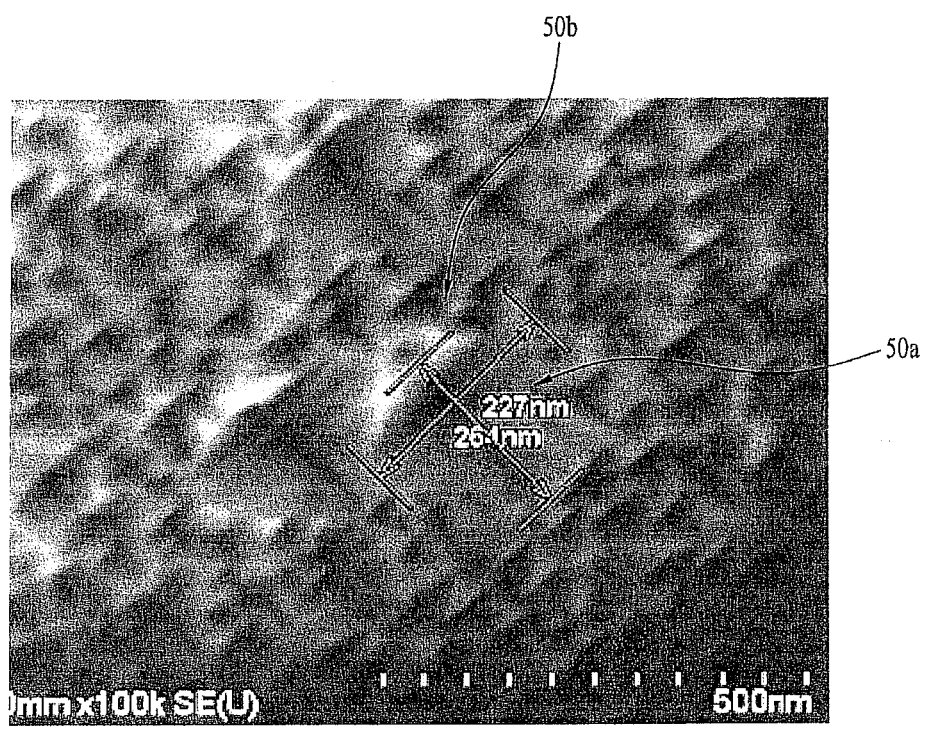
FIG. 7 is an SEM photograph of the surface of a light extraction layer.

FIG. 7 is an scanning electron microscope (SEM) photograph illustrating the surface of the light emitting diode having the above-stated structure in which the first layers 51 including InGaN and the second layers 52 including GaN are alternately stacked.

As shown in FIG. 7, it is known that the second unit structures 50b having a relatively small size are arranged between the first unit structures 50a.

Figure 8:
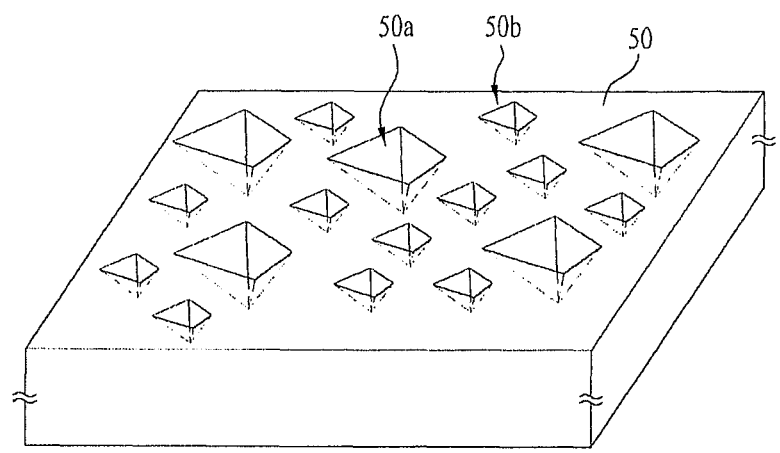
FIG. 8 is a schematic view illustrating other unit structures of a light extraction layer.

FIG. 8 is a schematic view illustrating first unit structures 50a and second unit structures 50b, and the second unit structures 50b may have the same shape as the first unit structures 50a. That is, the virtual base plane of each of the second unit structures 50b has a rectangular shape. Further, this rectangular shape may be a lozenge shape or diamond shape, and may be a shape in which lengths of four sides are not equal, in some cases.

However, the second unit structures 50b may have different shape from the first unit structures 50a according to growth conditions and environments.

The surface shape of the light extraction layer 50 on which the second unit structures 50b having a relatively small size are arranged between the first unit structures 50a may greatly improve surface roughness of the light extraction layer 50 without lowering of the quality of semiconductor crystals.

As described above, the surface shape of the light extraction layer 50 may greatly improve light extraction efficiency without formation of a separate light extraction structure. That is, the light extraction layer 50 may be formed by varying the growth condition under the same environment as an environment in which the n-type GaN layer 20, the active layer 30 including at least one InAlGaN layer, and the p-type GaN layer 40 are formed, thus improving light extraction efficiency while greatly reducing time and cost taken to fabricating the light emitting diode.

Figure 9:
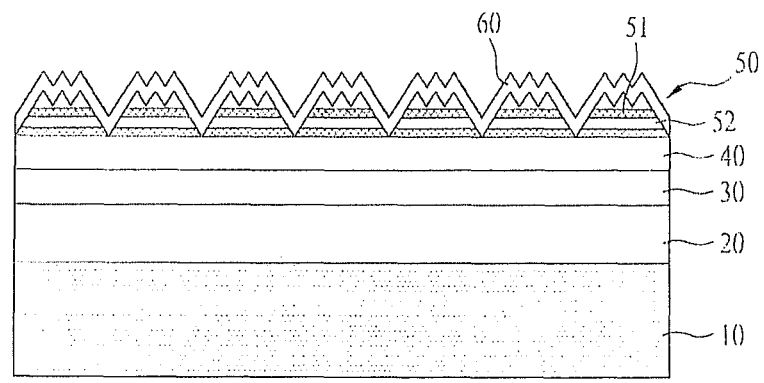
FIGS. 9 to 11 are cross-sectional views illustrating a process of fabricating a device using the structure of FIG. 6.

Thereafter, a p-type electrode may be formed directly on the light extraction layer 50. However, as shown in FIG. 9, an overdoped p-type GaN layer 60 may be formed on the light extraction layer 50 prior to formation of the p-type electrode on the light extraction layer 50.

Figure 10:
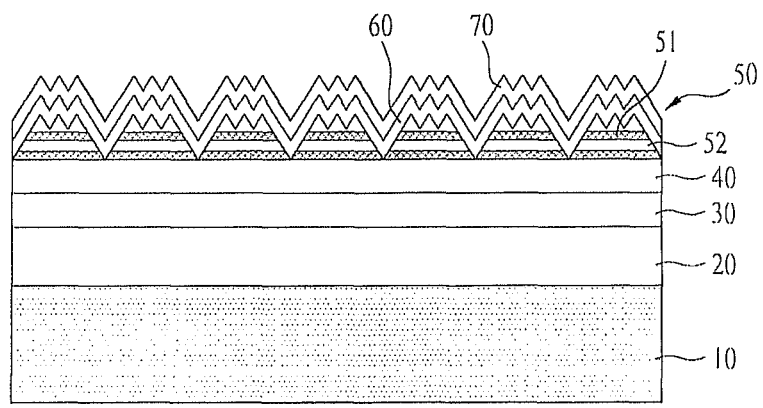

Thereafter, as shown in FIG. 10, a transparent conductive layer 70 may be formed on the overdoped p-type GaN layer 60. Here, the transparent conductive layer 70 may employ a transparent metal layer or a transparent conductive oxide layer, and indium tin oxide (ITO), indium zinc oxide (IZO), aluminum zinc oxide (AZO), magnesium zinc oxide (MZO) or gallium zinc oxide (GZO) may be used as the transparent conductive oxide.

Figure 11:
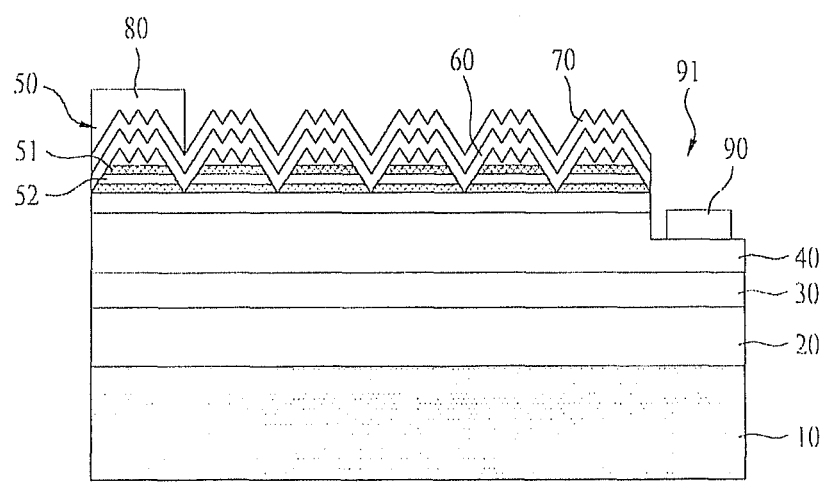

As shown in FIG. 11, a p-type electrode 80 is formed on the transparent conductive layer 70, and an n-type electrode 90 electrically connected to the n-type GaN layer 20 is formed in an opening 91 which is etched to expose the n-type GaN layer 20.

Figure 12:
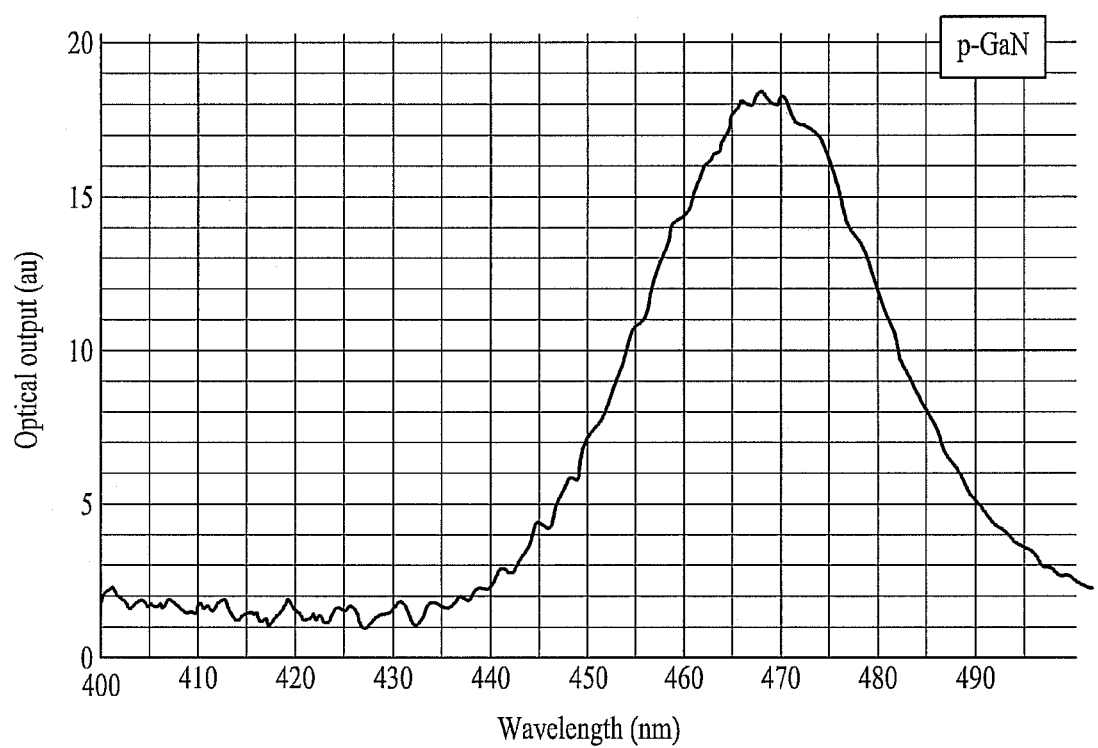
FIGS. 12 and 13 are graphs illustrating PL results of a case with a light extraction layer and a case without a light extraction layer.
Figure 13:
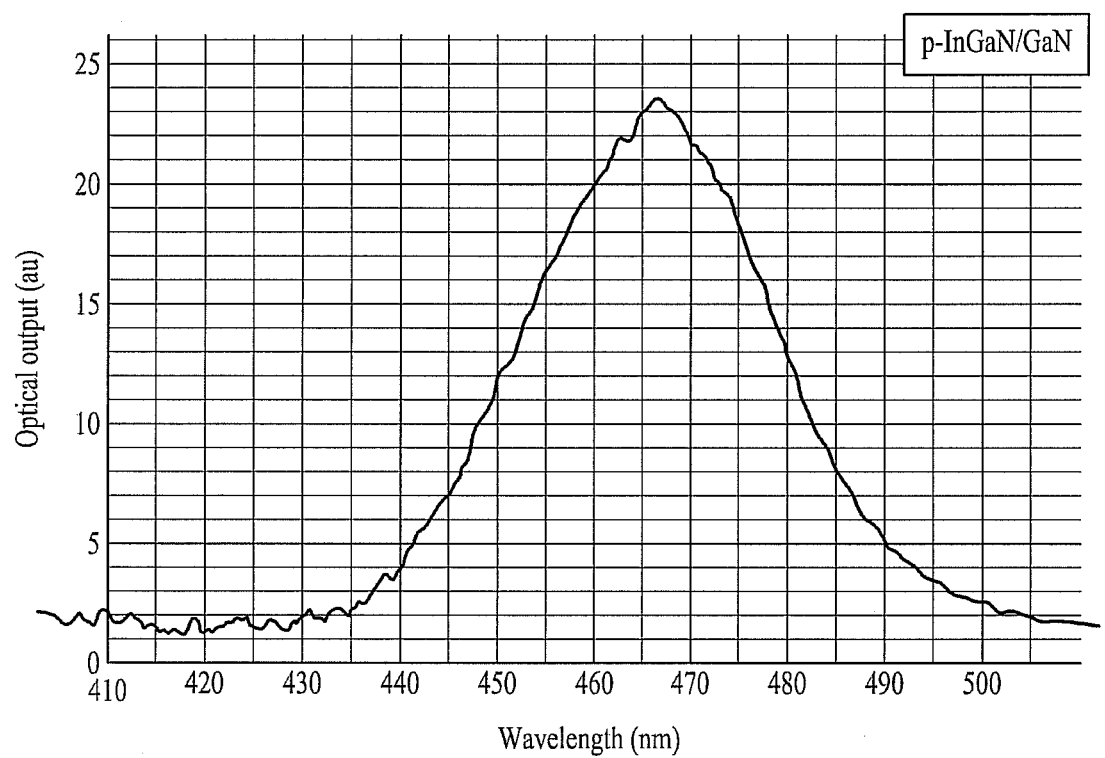

FIGS. 12 and 13 are graphs illustrating photo-luminance (PL) results measured at normal temperature. FIG. 12 is a graph illustrating PL results in case that only a p-type GaN layer is grown without a light extraction layer for comparison, and FIG. 13 is a graph illustrating PL results in case that the light extraction layer 50 having the above-described structure in which the first layers 51 including InGaN and the second layers 52 including GaN are alternately stacked is provided.

As shown in FIGS. 12 and 13, it may be confirmed that an intensity of PL at the central value of optical output of a device having a stacked structure (p-type InGaN/GaN) having the light extraction layer 50 is increased by 20% or more as compared to a device in which only the GaN layer is grown.

It is known that the reason for this is that, when light generated by the active layer is discharged to the outside of the light emitting diode, a total reflection degree is decreased due to the prominences and depressions formed on the surface of the light emitting diode, as compared to the sample having the flat surface, and thus light extraction efficiency is improved.

Figure 14:
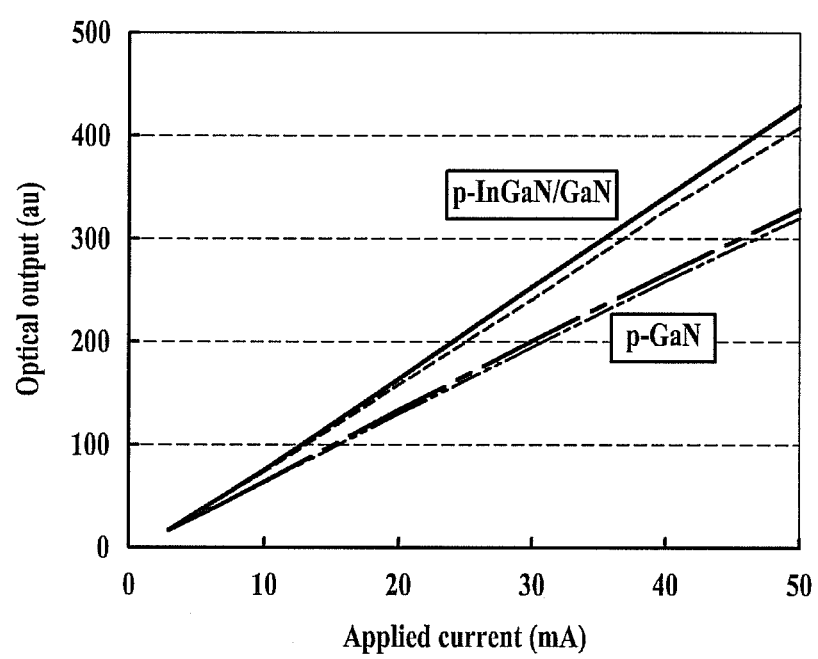
FIG. 14 is a graph illustrating EL results of a case with a light extraction layer.

FIG. 14 is a graph illustrating comparison of electro-luminescence (EL) results in case that only a p-type GaN layer is grown and in case that the above-described light extraction layer 50 is provided. That is, such a graph illustrates measured results of two samples, and it may be confirmed that optical outputs in both cases are improved.

As described above, it is measured that optical output of the device having the prominences and depressions formed on the surface of the light extraction layer in accordance with the embodiment of the present invention is increased by 20% or more as compared to the device in which only the GaN layer is grown. It is known that the reason for this is that, when light generated by the active layer is discharged to the outside of the light emitting diode, a total reflection degree is decreased by the prominences and depressions formed on the surface of the light emitting diode, as compared to the sample having the flat surface, and thus light extraction efficiency is improved.

As apparent from the above description, a light emitting diode using a non-polar GaN material which emits generated light through the surface of a p-type semiconductor layer has prominences and depressions having a specific shape in a crystal direction on the surface thereof by alternating a GaN material and an InGaN material having a different lattice constant and different thermal characteristics from the GaN material on a p-type semiconductor area, and thus decreases the probability of total reflection of light to improve light extraction efficiency, thereby improving photovoltaic efficiency of the light emitting diode without lowering of the quality of semiconductor crystals.

Further, technique of forming the prominences and depressions on the surface of the p-type semiconductor layer through a series of growth steps during a thin film growth process facilitates a fabricating process of the light emitting diode, as compared to a method using a patterned sapphire substrate.

Particularly, from among growth conditions of InGaN layers or GaN layers, growth conditions in which a growth velocity in the vertical direction is higher than a growth velocity in the horizontal direction are selected, thereby forming prominences and depressions to optimize light extraction efficiency of the light emitting diode.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A non-polar nitride-based light emitting device comprising:
   a substrate including r-plane sapphire;
   a semiconductor structure including a first-type semiconductor layer on the substrate, an active layer on the first-type semiconductor layer and a second-type semiconductor layer on the active layer, wherein the semiconductor structure comprises a-plane nitride semiconductor;
   a light extraction layer including a-plane nitride semiconductor on a surface of the semiconductor structure, wherein the light extraction layer comprises at least one layer including indium, the light extraction layer includes a plurality of unit structures having an inverted pyramidal intaglio shape, and wherein the unit structure has a lowest point where dislocation in the second-type semiconductor layer meets the light extraction layer;
   an overdoped second-type semiconductor layer having higher doping concentration than that of the second-type semiconductor layer on the light extraction layer, wherein a lowest portion of the unit structure is located between the surface of the semiconductor structure and the overdoped second-type semiconductor layer;
   a first electrode electrically connected to the first-type semiconductor layer; and
   a second electrode electrically connected to the second-type semiconductor layer.

2. The non-polar nitride-based light emitting device according to claim 1, wherein the inverted pyramidal intaglio shape is a pyramidal shape having a virtual base plane having a quadrangular shape.

3. The non-polar nitride-based light emitting device according to claim 2, wherein the virtual base plane has a lozenge shape or a diamond shape.

4. The non-polar nitride-based light emitting device according to claim 3, wherein the lozenge shape or the diamond shape is configured to be asymmetrical such that the length of two sides and the length of other two sides opposite the two sides are different.

5. The non-polar nitride-based light emitting device according to claim 1, wherein the light extraction layer has a structure in which at least one first layer and at least one second layer are alternately stacked.

6. The non-polar nitride-based light emitting device according to claim 5, wherein the at least one first layer comprises an InGaN layer and the at least one second layer comprises a GaN layer.

7. The non-polar nitride-based light emitting device according to claim 1, further comprising a transparent conductive layer on the light extraction layer.

8. The non-polar nitride based light emitting device according to claim 1, wherein the unit structure connects a dislocation in the semiconductor structure.

9. A non-polar nitride-based light emitting device comprising:
a substrate including r-plane sapphire;
a semiconductor structure including a first-type semiconductor layer on the substrate, an active layer on the first-type semiconductor layer and a second-type semiconductor layer formed on the active layer;
a light extraction structure including a plurality of first unit structures having an inverted pyramidal intaglio shape and a plurality of second unit structures located between the plurality of first unit structures, the second unit structure having an inverted pyramidal intaglio shape and a size smaller than the plurality of first unit structures, wherein the light extraction structure comprises at least one layer that includes indium,
wherein the light extraction structure is provided on a light extraction layer,
wherein at least one of the first-type semiconductor layer, the second-type semiconductor layer, or the active layer includes a-plane nitride semiconductor, and
wherein a lowest portion of the first unit structure is located at a top surface of the semiconductor structure, wherein the first unit structure connects a dislocation in the semiconductor structure;
an overdoped second-type semiconductor layer having higher doping concentration than that of the second-type semiconductor layer on the light extraction layer;
a first electrode electrically connected to the first-type semiconductor layer; and
a second electrode electrically connected to the second-type semiconductor layer.

10. The non-polar nitride-based light emitting device according to claim 9, wherein the inverted pyramidal intaglio shape is a pyramidal shape having a virtual base plane having a lozenge shape or a diamond shape.

11. The non-polar nitride-based light emitting device according to claim 9, wherein the light extraction layer includes InGaN.

12. The non-polar nitride-based light emitting device according to claim 9, wherein the light extraction layer has a structure in which at least one first layer and at least one second layer are alternately stacked.

13. The non-polar nitride-based light emitting device according to claim 12, wherein the at least one first layer comprises a layer including InGaN and the at least one second layer comprises a layer including GaN.

14. The non-polar nitride-based light emitting device according to claim 9, wherein a lowest portion of a first or second unit structure is located between the surface of the semiconductor structre and the overdoped second-type semiconductor layer.

15. A method for fabricating a non-polar nitride-based light emitting device comprising:
forming an a-plane semiconductor structure including a first-type semiconductor layer, an active layer and a second-type semiconductor layer on a r-plane sapphire substrate;
forming a light extraction layer including a material that is different from a material of the second-type semiconductor layer, wherein the light extraction layer comprises at least one layer including indium on a surface of the semiconductor structure, the light extraction layer forming a plurality of unit structures with an inverted pyramidal intaglio shape on the semiconductor structure such that the unit structure is formed at a top surface of the semiconductor structure, wherein the unit structure is started from dislocation in the second-type semiconductor layer;
forming an overdoped second-type semiconductor layer having higher doping concentration than that of the second-type semiconductor layer on the light extraction layer;
forming a transparent conductive layer on the overdoped second-type semiconductor layer;
forming a first electrode electrically connected to the first-type semiconductor layer; and
forming a second electrode on the transparent conductive layer.

16. The method according to claim 15, wherein the light extraction layer has a structure in which at least one first layer including InGaN and at least one second layer including GaN are alternately stacked.

17. The method according to claim 16, wherein at least two pairs of the at least one first layer and the at least one second layer are alternately stacked.

18. The method according to claim 15, wherein the formation of the light extraction layer is carried out in a condition that a growth velocity in the vertical direction is higher than a growth velocity in the horizontal direction.

19. The method according to claim 15, wherein the unit structure connects a dislocation in the semiconductor structure.

* * * * *